United States Patent
Aspar et al.

(10) Patent No.: US 6,335,258 B1
(45) Date of Patent: Jan. 1, 2002

(54) METHOD FOR MAKING A THIN FILM ON A SUPPORT AND RESULTING STRUCTURE INCLUDING AN ADDITIONAL THINNING STAGE BEFORE HEAT TREATMENT CAUSES MICRO-CAVITIES TO SEPARATE SUBSTRATE ELEMENT

(75) Inventors: Bernard Aspar, Rives; Michel Bruel, Veurey; Thierry Barge, Grewoble, all of (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/284,801

(22) PCT Filed: Nov. 4, 1997

(86) PCT No.: PCT/FR97/01969

§ 371 Date: Jun. 18, 1999

§ 102(e) Date: Jun. 18, 1999

(87) PCT Pub. No.: WO98/20543

PCT Pub. Date: May 14, 1998

(30) Foreign Application Priority Data

Nov. 5, 1996 (FR) ............................................ 96 13449

(51) Int. Cl.⁷ .......................... H01L 21/76; H01L 21/30; H01L 21/46; H01L 21/301
(52) U.S. Cl. ....................... 438/406; 438/459; 438/464; 438/977

(58) Field of Search ................................ 438/406, 459, 438/464, 977, 924

(56) References Cited

U.S. PATENT DOCUMENTS

| | | | |
|---|---|---|---|
| 5,256,581 A | * | 10/1993 | Foerstner et al. |
| 5,494,835 A | * | 2/1996 | Bruel |
| 5,854,123 A | * | 12/1998 | Sato et al. |
| 5,863,830 A | * | 1/1999 | Bruel et al. |
| 5,920,764 A | * | 7/1999 | Hanson et al. |
| 5,993,677 A | * | 11/1999 | Biasse et al. |
| 6,020,252 A | * | 2/2000 | Aspar et al. |
| 6,150,239 A | * | 11/2000 | Goescle et al. |

* cited by examiner

Primary Examiner—John F. Niebling
Assistant Examiner—Ron Pompey
(74) Attorney, Agent, or Firm—Burns Doane Swecker & mathis LLP

(57) ABSTRACT

The present invention relates to a production method for a thin film on a support that includes an ionic implantation stage in order to demarcate the thin film in a substrate, the aim of the ionic implantation being to create a layer of micro-cavities in the substrate, a stage to bond the substrate to a support element using close contact and a heat treatment stage intended to bring the layer of micro-cavities to a temperature that is high enough to cause a split along said layer. At least one of said elements, substrate or support, is thinned before the heat treatment stage in order to maintain the close contact between the substrate and the support despite the stresses caused in the elements and resulting from the difference in their thermal dilation coefficients.

11 Claims, 1 Drawing Sheet

METHOD FOR MAKING A THIN FILM ON A SUPPORT AND RESULTING STRUCTURE INCLUDING AN ADDITIONAL THINNING STAGE BEFORE HEAT TREATMENT CAUSES MICRO-CAVITIES TO SEPARATE SUBSTRATE ELEMENT

DESCRIPTION

1. Field of the Invention

The present invention relates to a production method for a thin film of solid material on a support, particularly when said solid material and said support have different thermal behavior. The thin film may be of a semiconductor material or not. The invention also relates to the structure obtained by said production method.

2. Background Art

Numerous methods for producing thin films of solid material are known. Said methods depend on the type of material and of the thickness of the preferred film. Thin films of a solid material can therefore be applied to the face of a part by being propelled, sprayed, electroplated etc. A thin film can also be obtained by thinning a plate of the preferred material using mechanical chemical or chemical abrasion, the thin film obtained then being stuck or bonded onto the part being used as a support.

Generally, a thin film is bonded to a face of a part to alter the properties of the part superficially.

In the field of semiconductors, thin films for semiconductors are also often made for example to manufacture substrates called "Silicon On Insulator". Different methods for producing semiconductor thin films have been developed. One of the most recent methods is based on the fact that the ions of a rare gas or hydrogen implanted in semiconductor material cause weakened areas to form at a depth similar to the average penetration depth of the ions. French document 2 681 472 discloses a method that uses this property to obtain a thin film of semiconductor material. Said method consists in subjecting a plate of the preferred semiconductor material and that comprises a flat face to the following stages:

- a first implantation stage in which the flat face of the plate is bombarded with ions to create a layer of "gaseous micro-bubbles" in the volume of the plate and to a depth similar to the penetration depth of the ions, said layer separating the plate by a lower area that constitutes the substrate mass and an upper area that constitutes the thin film. The ions are chosen from the ions of rare gas or of hydrogen gas;
- a second stage in which the flat face of the plate is put into close contact with a support (or stiffener) that comprises at least one layer of rigid material. Said close contact can be achieved using an adhesive substance applied to the faces that have been previously prepared and heat and/or electrostatic treatment to allow inter-atomic bonding between the support and the plate;
- a third stage consisting of heat treatment of the plate and support assembly at a temperature that is higher than the temperature during which the implantation was effected and that is high enough to create a separation between the thin film and the substrate mass. The temperature is approximately 400° C. for silicon.

The present document proposes the following explanation of the various phenomena reported. Firstly, the initial stage is carried out by beaming ions onto a flat face of a semiconductor material plate, the plane of said flat face being more or less parallel to a main crystallographic plane when the semiconductor material is perfectly monocrystalline or slightly inclined relative to a main crystallographic plane of the same indices for all the grains if the material is polycrystalline. A layer of "gaseous micro-bubbles" is therefore created in the volume of the plate. Said layer is located at a depth similar to the average penetration depth of the ions and demarcates two areas in the volume that is separated by said layer: an area intended to constitute the thin film and an area that constitutes the rest of the substrate. "Gaseous micro-bubbles" refers to any cavities or micro-cavities created by the implantation of hydrogen gas or rare gas ions in the material. The cavities may be extremely shallow, i.e. of very slight depth, for example of only a few inter-atoms, or they may be more or less hemispherical or any shape other than the two above-mentioned shapes. Said cavities may or may not include a gaseous phase. During the third stage the heat treatment is effected at a temperature high enough to cause the separation between the two regions. Said separation is achieved by the crystalline being rearranged in the semiconductor material, for example by the micro-cavities increasing in size and/or as a result of pressure from the micro-bubbles.

This method would appear to be suitable for any type of solid material, whether crystalline or not. It is possible for this method to be applied to dielectric, conducting and semi-insulating materials as well as amorphous semiconductor materials. Furthermore, this method does not basically alter the properties of the material to which it is applied.

The implantation of hydrogen or rare gas ions can therefore also cause micro-cavities to form in solid materials other than a crystalline semiconductor material. Subsequent heat treatment- can lead to splitting in the material mass if the implantation stage is carried out in such a way as to obtain a layer of micro-cavities.

Furthermore, the heat treatment stage that causes splitting is preferably defined in relation to a thermal budget that depends on the thermal budget of the ionic implantation stage and of the dose and the power of ions implanted and any other thermal budgets resulting from other stages. Therefore, under certain conditions annealing may occur at a lower temperature to that used during implantation.

However, the application of this method may present certain problems when the substrate in which a thin film is demarcated and the stiffener have different thermal dilation coefficients, or at least if they are too different. If this is the case, during the heat treatment stage competition occurs between the adherence forces retaining the implanted substrate and the stiffener that is in close contact, the forces being due to the differences in thermal dilation coefficients (that tend to separate the substrate from the stiffener) and the forces that cause splitting in the micro-cavities, said splitting being caused by the implantation of ions.

It is not usually easy to determine which force will be the stronger during the heat treatment stage. However, the inventors of the present invention have emphasized the fact that a separation may occur at the interface when the substrate is put into contact with the stiffener during said heat treatment and not in the area of the micro-cavities when the materials that constitute the substrate and the stiffener have different thermal dilation coefficients.

In order to implement the method for producing a thin film according to French document 2 681 472, the definition may be given as two materials having different thermal dilation coefficients within a given temperature range when said materials are brought into close contact with one another, thus creating thickness elements that are considered adjacent that are not able to withstand heat treatment within the given temperature range. This results in the two elements separating.

Disclosure of the Invention

To overcome this drawback, the present invention proposes to apply the heat treatment stage to the assembly consisting of the stiffener and the implanted substrate that come into close contact when at least one of said elements has taken the shape of a thin layer. When this occurs, the thin layer retains enough elasticity to withstand the distortion caused by the other material without forcing the two materials to separate.

The invention therefore plays on the thickness of one of the elements of the assembly in order that said element, which has become sufficiently thin, is capable of adapting to the distortions to which it is subject by the other element during the heat treatment stage. A split in the plane of the micro-cavities can therefore occur without causing problems for achieving the preferred thin film.

The aim of the invention is therefore a method for producing a thin film made of a first material on a support and a second material, said method comprising:

- an ionic implantation stage during which a face of a substrate of said first material is bombarded with ions to create a layer of micro-cavities in the volume of the substrate and to a depth similar to the penetration depth of the ions, said layer separating the substrate in two areas, the area located between said bombarded face of the substrate and the layer of micro-cavities constituting the thin film.
- a bonding stage in which said bombarded face of the substrate is put into close contact with a corresponding face of the support,
- a final heat treatment stage intended to bring the layer of micro-cavities to a temperature high enough to cause the two areas of the substrate to separate,
- the method being characterized in that it also comprises a thinning stage of at least one of said elements, substrate or support. The thickness of the thinned element is such that the assembly, constituted by the elements bonded together by said close contact, can withstand the heat treatment stage that causes said separation while conserving said close contact despite the stresses to which said elements are subject and that are due to the difference in their thermal dilation coefficients.

When the thinning stage concerns the substrate it can take place before the ionic implantation stage or after the ionic implantation stage and before the support bonding stage or after the support bonding stage and before the final heat treatment stage.

Another object of the invention is a production method for a thin film made of a first material on a support made of a second material comprising the following stages:

- a stage for bonding a substrate of said first material, said substrate having two main parallel faces, onto a first support element using close contact of one of the main faces of the substrate with a corresponding face of the first support element,
- a thinning stage of said substrate on its other main side, the thickness of the thinned substrate being such that it can withstand the subsequent heat treatment stage while remaining in the preferred close contact with other elements despite the stresses that are due to the difference in thermal dilation coefficients between the substrate and said other elements,
- an ionic implantation stage during which the free main face of the thinned substrate is bombarded with ions to create a layer of micro-cavities in the volume of the substrate and to a depth similar to the penetration depth of the ions, said layer separating the substrate in two areas, the area located between said bombarded face of the substrate and the layer of micro-cavities constituting the thin film.
- a stage in which the thinned substrate is bonded onto a second support element by close contact of the bombarded face with a corresponding face of the second support element,
- a final heat treatment stage intended to bring the micro-cavity layer to a temperature high enough to cause a split along said micro-cavity layer.

Advantageously, the ions used during the implantation stage are chosen from ions of rare gas and hydrogen gas.

Thinning can be achieved using mechanical grinding, mechanical/chemical polishing or by chemical means, or using a combination of said techniques.

In a bonding stage, close contact can be achieved using electrostatic forces or using glue or by using a gluing technique involving molecular adhesion that is reinforced by annealing at a lower temperature than the minimum temperature required to cause the two areas of he substrate to separate. Said annealing operation that reinforces the molecular adhesion can be achieved in several phases that alternate with the thinning phases.

By "substrate", a monolithic structure is implied as well as a multi-layer structure.

Another object of the invention is a structure composed of a support made of a second material that bears a thin film made of a first material, characterized in that said structure is achieved using the method described above.

The invention has particular applications when the first material, that constitutes the thin film, is made of silicon and when the second material, that constitutes the support, is made of silica.

BRIEF DESCRIPTION OF THE DRAWINGS

Greater understanding of the invention will be reached and other advantages and particularities will become clear upon reading the following description. Said description is given as a non-limitative example and is accompanied by the attached drawings in which.

DETAILED DESCRIPTION OF AN EMBODIMENT OF THE INVENTION

In the following section of the description, and as an example, the thinning stage is applied to the substrate in which the thin film is shaped by ionic implantation. Said thinning must be a compromise between minimum thinning of the substrate, that is required in order to avoid the thin film separating from the support in the heat treatment stage, and maximum thinning beyond which there is a risk, during the heat treatment, of the micro-bubbles (micro-cavities) moving towards the face of the thinned substrate and consequently causing blisters.

The substrate is not necessarily a semiconductor substrate. When the substrate is a semiconductor it can comprise elements of integrated circuits.

The application of the method disclosed in French document 2 681 472 for silicon coating, for example monocrystalline, onto a support (or stiffener) can be achieved by completely different means according to the nature of the material that constitutes the support. If the support must be made of glass, glass compositions can be used such that the thermal dilation coefficients are sufficiently similar to that of silicon. For example, glass used for liquid crystal screens has a linear thermal dilation coefficient of $4.3 \cdot 10^{-6}/°C$. whereas the same coefficient is $2.6 \cdot 10^{-6}/°C$. for silicon. These coefficients are sufficiently similar to enable the method described in French document 2 681 472 to be applied without any problem, enabling the heat treatment stage to be brought to between 300 and 600° C.

If the support is made of pure silica problems may arise. The linear thermal dilation coefficient of pure silica is too different from that of silicon ($5.10^{-7}/°C$.) to enable a plate of silicon 525 $\mu$m thick, for example that is in close contact with a plate of pure silica 500 $\mu$m thick, to withstand heat treatment at a temperature over 200° C. During heat treatment the plate of pure silica does almost not dilate relative to the silicon plate. This results in considerable mechanical stresses appearing during the heat treatment that cause the plates to separate.

The method according to the present invention enables a thin film of silicon on a silica support to be obtained. The method will now be described in greater detail in one of the possible versions of application.

Figure 1:
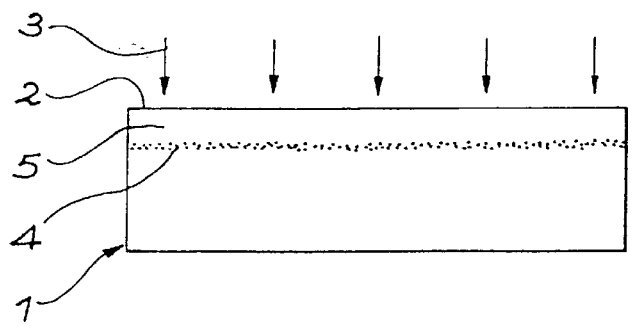
FIG. 1 shows the ionic implantation stage of the method according to the invention.
Figure 2:
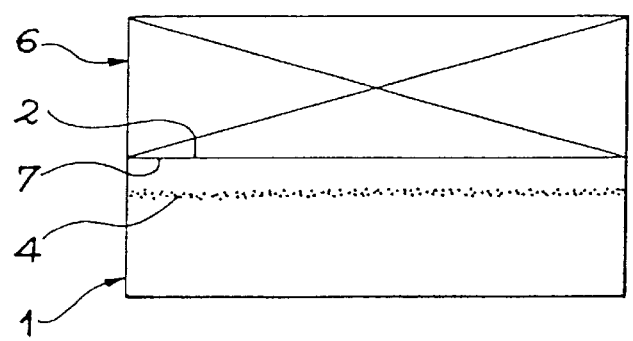
FIG. 2 shows the close contact stage according to the invention.

Referring to FIG. 1 a silicon substrate 1 is subject to a bombardment of ions, generally referred to as 3, through one of its main faces, referred to as 2. The ions can be hydrogen ions implanted to a dose of $5.10^{16}/cm^2$ and 150 keV power. Layer 4, called a gaseous micro-bubble layer, is therefore created at a depth similar to the average penetration depth of the ions. Area 5, located between face 2 and layer 4, constitutes the thin film.

Silicon substrate 1 is then put into close contact with a support 6, face 2 of the substrate 1 being adjacent to face 7 of support 6. Said close contact can be achieved using any known means, the surfaces of faces 2 and 7 having been prepared for this purpose. For example, close contact can be obtained using molecular adhesion once the exteriors have been suitably cleaned, by using a film of epoxy glue or by using electrostatic-type pressure.

At this stage it may be useful to subject the substrate/support assembly to an annealing operation that is intended to strengthen the connecting forces between the substrate 1 and the support 6. The temperature of said annealing operation must be high enough to increase the adhesion forces between the two elements but lower than the temperature that causes the thin film 5 to separate from the rest of the substrate.

The following stage consists in thinning the silicon substrate 1. Said thinning can be achieved by polishing, mechanical or mechanical chemical grinding. Said thinning techniques may be combined. For example, grinding can be used to thin the plate by several hundred $\mu$m. As grinding causes stress related defects measuring a few $\mu$m, the defects may be removed using chemical means. Tetramethylammonium hydroxide may be used as a treating solution for silicon as at 80° C. it is effective at a speed of approximately 20 $\mu$m/h. The final thinning that is achieved must be such that the thickness of the remaining silicon is sufficiently elastic to withstand the stresses to which it is subject by the temperature during the final stage of the method.

As mentioned above, said thinning stage can be effected before the substrate 1 comes into close contact with support 6 and even before the implantation stage of substrate 1.

Figure 3:
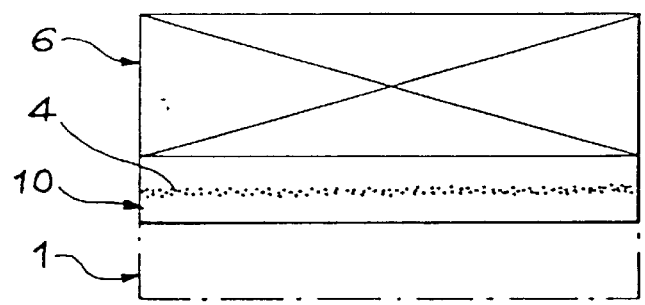
FIG. 3 shows the thinning stage according to the invention.

FIG. 3 shows the substrate/support assembly after substrate 1 has been thinned, the mass removed from the substrate being shown by broken lines and the thinned section being referred to as 10.

In order to strengthen the connecting forces between the substrate 1 and the support 6, it can be advantageous to effect an annealing operation in several phases alternating thinning phases with the progressive temperature increase of the annealing. If a silicon substrate and a pure silica support are used, the following annealing operations can be effected once the two elements have been put into close contact and if bonding is achieved by molecular adhesion of a support and a substrate each being approximately 500 $\mu$m thick:

first annealing operation at 100° C. for several hours, thinning of implanted substrate in order to obtain thickness less than 100 $\mu$m, second annealing operation at 200° C. for several hours, thinning of implanted substrate in order to obtain thickness less than 40 $\mu$m.

Figure 4:
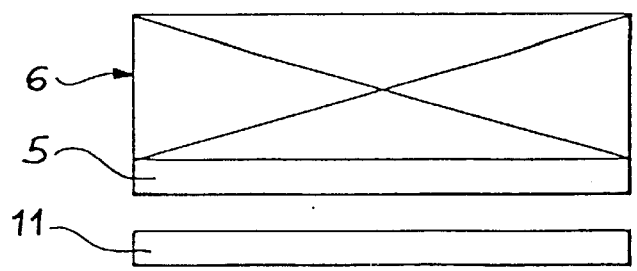
FIG. 4 shows the final heat treatment stage according to the invention.

In the last stage an isothermal heat treatment is applied that heats the assembly constituted by the support 6 and the thinned section 10 of silicon substrate 1 uniformly to a temperature high enough to cause the thin film 5 and the rest 11 of thin section 10 to separate due to the crystalline being rearranged and due to pressure in the micro-bubbles. This is shown in FIG. 4.

By implementing the method according to the invention, thin section 10 has been able to withstand the stresses of thermal dilation due to support 6 in the final stage without becoming unstuck from the support. The silicon mass has split into two sections correctly in the plane of the gaseous micro-bubbles in order to provide a thin silicone mass 5 that adheres to a silica support 6.

If it is decided to thin the support at the same time as or instead of the substrate, the operation is identical to that described above for the substrate.

What is claimed is:

1. Production method for a thin film made of a first material on a support made of a second material, said method comprising:

an ionic implantation stage during which a face of a substrate of said first material is bombarded with ions in order to create a layer of micro-cavities in the volume of the substrate and to a depth similar to the penetration depth of the ions, said layer separating the substrate into two areas, the area located between said bombarded face of substrate and the layer of micro-cavities constituting the thin film, a bonding stage in which said bombarded face of substrate is put into close contact with a corresponding face of the support, a final heat treatment stage intended to bring the layer of micro-cavities to a temperature high enough to cause the two areas of the substrate to separate, the method also comprising a thinning stage of at least one of said elements, substrate or support, the thickness of the thinned element being such that the assembly, constituted by the elements bonded together by said close contact, can withstand the heat treatment stage that causes said separation while conserving said close contact despite the stresses to which said elements are subject and that are due to the difference in their thermal dilation coefficients.

2. Production method for a thin film made of a first material on a support made of a second material, said method comprising:

an ionic implantation stage during which a face of a substrate of said first material is bombarded with ions in order to create a layer of micro-cavities in the volume of the substrate and to a depth similar to the penetration depth of the ions, said layer separating the substrate into two areas, the area located between said bombarded face of substrate and the layer of micro-cavities constituting the thin film, a bonding stage in which said bombarded face of substrate is put into close contact with a corresponding face of the support, a final heat treatment stage intended to bring the layer of micro-cavities to a temperature high enough to cause the two areas of the substrate to separate, the method also comprising a thinning stage of at least one of said elements, substrate or support, the thickness of the thinned element being such that the assembly, constituted by the elements bonded together by said close contact, can withstand the heat treatment stage that causes said separation which conserving said close contact despite the stresses to which said elements are subject and that are due to the difference in their thermal dilation coefficients, wherein the thinning stage concerns substrate, said substrate being thinned before the ionic implantation stage.

3. Method of claim 1 wherein the thinning stage concerns substrate, said substrate being thinned after the ionic implanation stage and before the stage of being bonded to the support.

4. Method of claim 1 wherein the thinning stage concerns substrate, said substrate being thinned after the ionic implantation stage and before the final heat treatment stage.

5. A production method comprising the following stages:

a first stage for bonding a substrate of said first material, said substrate having two main parallel faces, onto a first support element using close contact of one of the main faces of the substrate with a corresponding face of the first support element, a second thinning stage constituted by said substrate on its other main side, a third ionic implanation stage during which the free main face of the thinned substrate is bombarded with ions, a fourth stage that consists in bonding the thinned substrate onto a second support element by close contact of the bombarded face with a corresponding face of the second support element, a fifth stage that consists in implementing the heat treatment intended to bring the micro-cavity layer to a temperature high enough to cause a split along said micro-cavity layer.

6. Method of claim 1 wherein the ions that are used in the implantation stage are chosen from rare gas and hydrogen gas ions.

7. Method of claim 1 wherein the said thinning is effected using mechanical grinding, mechanical/chemical polishing or by chemical means, or using a combination of said techniques.

8. Method of claim 1 wherein the close contact is achieved using a gluing technique involving molecular adhesion that is reinforced by annealing at a lower temperature than the minimum temperature required to cause the two areas of the substrate to separate.

9. Method of claim 8 wherein the annealing operation to reinforce the molecular adhesion is effected in several stages that alternate with thinning stages including the thinning stage.

10. The utilization of claim 1 in order to obtain a thin silicon film on a silica support.

11. The utilization of claim 10 in order to obtain a thin silicon film on a silica support.

* * * * *